(12) United States Patent
DeLaCruz (10) Patent No.: US 10,050,003 B2
(45) Date of Patent: Aug. 14, 2018

(54) ELONGATED PAD STRUCTURE

(71) Applicant: eSilicon Corporation, San Jose, CA (US)

(72) Inventor: Javier DeLaCruz, Summit, NJ (US)

(73) Assignee: eSilicon Corporation, San Jose, CA (US)

( * ) Notice: Subject to any disclaimer, the term of this patent is extended or adjusted under 35 U.S.C. 154(b) by 0 days.

(21) Appl. No.: 14/963,081

(22) Filed: Dec. 8, 2015

(65) Prior Publication Data

US 2016/0163669 A1 Jun. 9, 2016

Related U.S. Application Data

(60) Provisional application No. 62/089,095, filed on Dec. 8, 2014.

(51) Int. Cl.
| | |
|---|---|
| *H01L 23/48* | (2006.01) |
| *H01L 23/52* | (2006.01) |
| *H01L 29/40* | (2006.01) |
| *H01L 23/00* | (2006.01) |
| *H01L 23/498* | (2006.01) |

(52) U.S. Cl.
CPC ........ *H01L 24/17* (2013.01); *H01L 23/49827* (2013.01); *H01L 23/49838* (2013.01); *H01L 2224/16227* (2013.01); *H01L 2924/10253* (2013.01); *H01L 2924/351* (2013.01)

(58) Field of Classification Search
None
See application file for complete search history.

(56) References Cited

U.S. PATENT DOCUMENTS

| | | | |
|---|---|---|---|
| 2008/0185735 A1* | 8/2008 | Pham | H01L 23/49838 257/778 |
| 2015/0091187 A1* | 4/2015 | Reber | H01L 23/481 257/774 |
| 2016/0035664 A1* | 2/2016 | We | H01L 23/49861 257/686 |

* cited by examiner

*Primary Examiner* — Calvin Choi
(74) *Attorney, Agent, or Firm* — Fenwick & West LLP (57) ABSTRACT

A 3DIC includes a die and a substrate. The die includes multiple bumps to provide electrical connection the substrate. The substrate includes multiple elongated contact pads. The elongated contact pads making electrical contact with the bumps and shaped to maintain alignment with the bumps over a temperature range.

14 Claims, 7 Drawing Sheets

FIG. 7

ELONGATED PAD STRUCTURE

CROSS REFERENCE TO RELATED APPLICATIONS

This application claims the benefit of U.S. Provisional Application No. 62/089,095, filed Dec. 8, 2014, which is incorporated by reference in its entirety.

BACKGROUND

1. Field of the Invention

This invention relates to elongated contact pad structures.

2. Description of the Related Art

Substrates with different coefficient of thermal expansion compared to silicon are used in three dimensional (3D) and 2.5D integrated circuits (collectively, 3DICs). Due to the difference in coefficient of thermal expansion, the substrates of the 3DICs may misalign. Furthermore, large monolithic dies with small contact bumps may also misalign from the contact pads of a substrate the monolithic die is connected to due to a mismatch om the coefficient of thermal expansion between the monolithic die and the substrate.

Thus, there is a need for an improved contact pad structure that stays aligned at room temperature, as well as at elevated temperatures.

SUMMARY

The present invention overcomes the limitations of the prior art by including an elongated pad that stays aligned at elevated temperatures. The elongation of the pads may depend on the distance between the pad and the center of the substrate.

A 3DIC includes a die and a substrate. The die includes multiple bumps to provide electrical connection to elongated pads of a substrate. Each elongated pad of the substrate corresponds to a bump of the die at a first temperature and is also aligned to the same corresponding bump at a second temperature. In some embodiments, the first temperature is room temperature and the second temperature is a solder reflow temperature.

In some embodiments, the amount of elongation of the pads is based on a position of the pad on the substrate, a mismatch between a coefficient of thermal expansion of the die and a coefficient of thermal expansion of the substrate, and/or the second temperature. Additionally, in some embodiments, the elongated pads are elongated radially from a central point of the substrate.

Other aspects include components, devices, systems, improvements, methods, processes, applications and other technologies related to the foregoing.

BRIEF DESCRIPTION OF THE DRAWINGS

The invention has other advantages and features which will be more readily apparent from the following detailed description of the invention and the appended claims, when taken in conjunction with the accompanying drawings, in which:

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. Alternative embodiments of the structures and methods illustrated herein may be employed without departing from the principles described herein.

Figure 1:
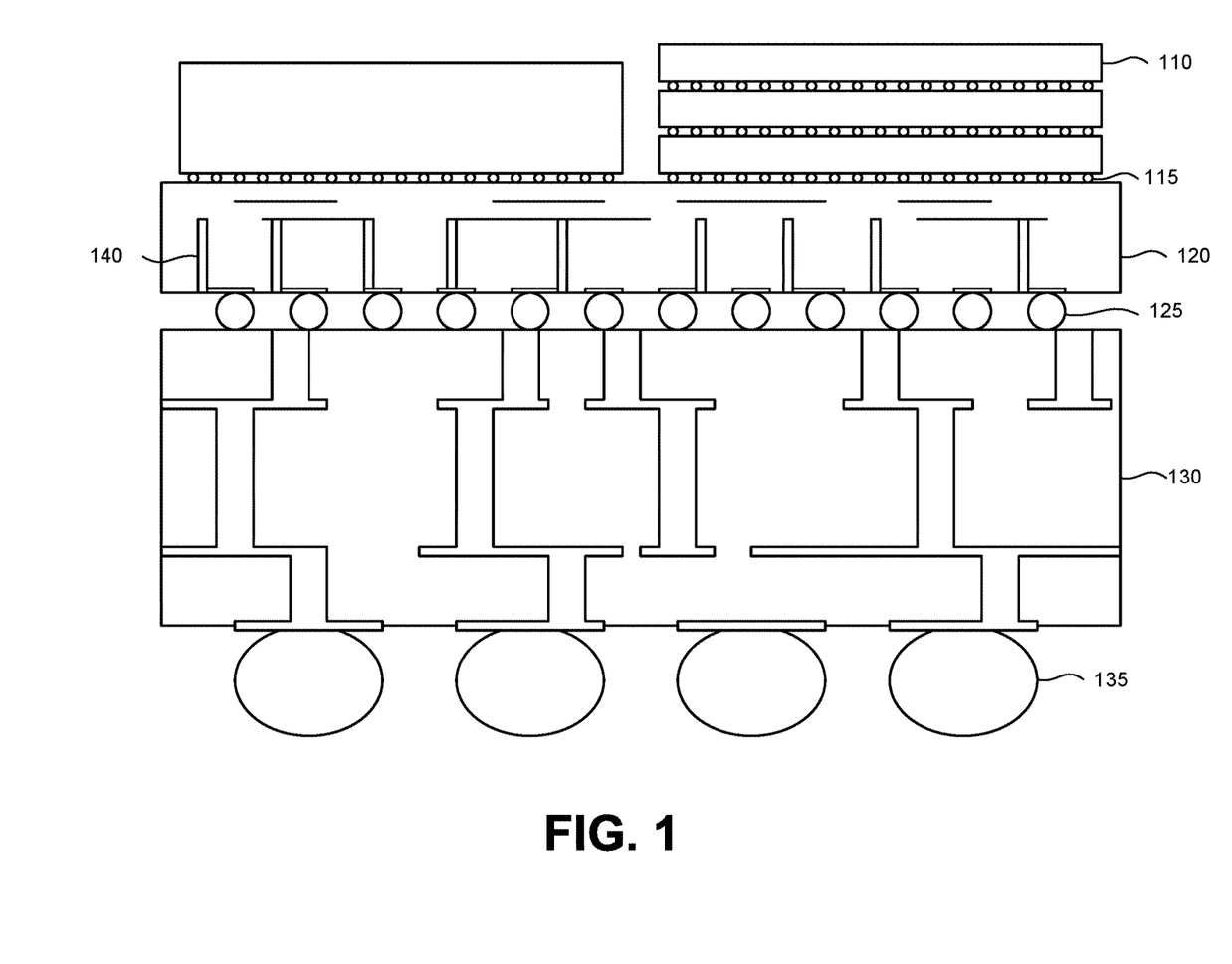
FIG. 1 is a cross sectional side view of a three dimensional integrated circuit (3DIC), according to one embodiment of the invention.

FIG. 1 is a cross sectional side view of a three dimensional (3D) and 2.5D integrated circuit (3DIC). A 3DIC typically includes a stack of alternating active chips and silicon interposers. As shown in FIG. 1, an exemplary 3DIC may include several tiles 110 (e.g., logic, field programmable gate arrays or FPGA, memory-stacks, integrated passive devices or IPD, etc), a passive silicon interposer 120 and an organic laminate 130. In order to route signals, one or more of these components may include thru-silicon vias (TSV).

The tiles 110 may include integrated circuits fabricated on a piece of semiconductor material. Tiles 110 may be a logic tile (e.g., a microprocessor, an application specific integrated circuit or ASIC, a field programmable gate array or FPGA), a memory tile (e.g., a random access memory or RAM, a non-volatile such a NAND flash memory) or integrated passive devices (e.g., impedance matching circuits, harmonic filters, couplers, etc.). In some embodiments, a module may be spread across multiple tiles 110. For instance, a 1 GB RAM module may be spread across two tiles 110, each having 512 MB RAM module.

The passive silicon interposer 120 interconnects multiple tiles 110 to each other. For instance, a silicon interposer may couple a logic tile with multiple memory tiles. The tiles connect to the silicon interposer through a microbump 115. Microbumps 115 of the tiles 110 may be aligned to contact pads in one side of the silicon interposer 120 to form an electrical connection between the an input/output (IO) port of the tile 110 and an IO port of the silicon interposer 120. In some embodiments, a thermal process may be used to bond the microbumps of the tiles 110 to the contact pads of the silicon interposer. For example, a solder reflow process may be used to reflow the microbumps of the tile 110 and bond the IO ports of the tiles 110 to the IO ports of the silicon interposer 120.

The organic laminate 130 is coupled to the silicon interposer 120 through bumps 125. The organic laminate 130 routes the signals received through bumps 125 to out of the 3DIC though solder balls 135, and routes the signals received through solder balls 135 to the silicon interposer 120 through bumps 125.

In some embodiments, the organic laminate 130 reduces the density of IO ports of the silicon interposer 120. As such, the organic laminate 130 may have a larger area than the silicon interposer 120. The organic laminate 130 may be manufactured with materials with lower cost than the material used to manufacture the silicon interposer 120. Since the silicon interposer 120 and the organic laminates are manufactured with different materials, the silicon interposer 120 and the organic laminate 130 may have different coefficients of thermal expansion. As such, during thermal processes of the fabrication of the 3DIC and during the use of the 3DIC, the silicon interposer 120 and the organic laminate 130 will expand at different rates, which may cause misalignment between the IO ports of the silicon interposer 120 and the IO ports of the organic laminate 130.

Figure 2A:
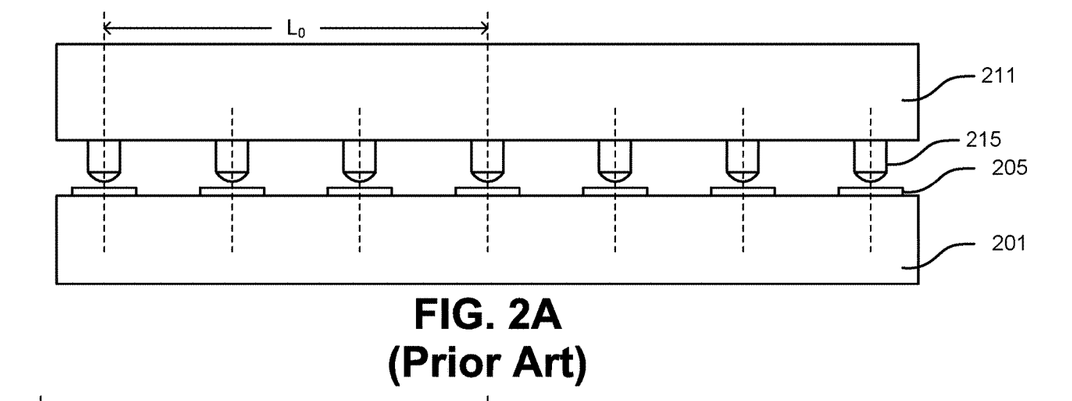
FIG. 2A (prior art) is a cross sectional view of a die and a substrate with different coefficients of thermal expansion at room temperature.
Figure 2B:
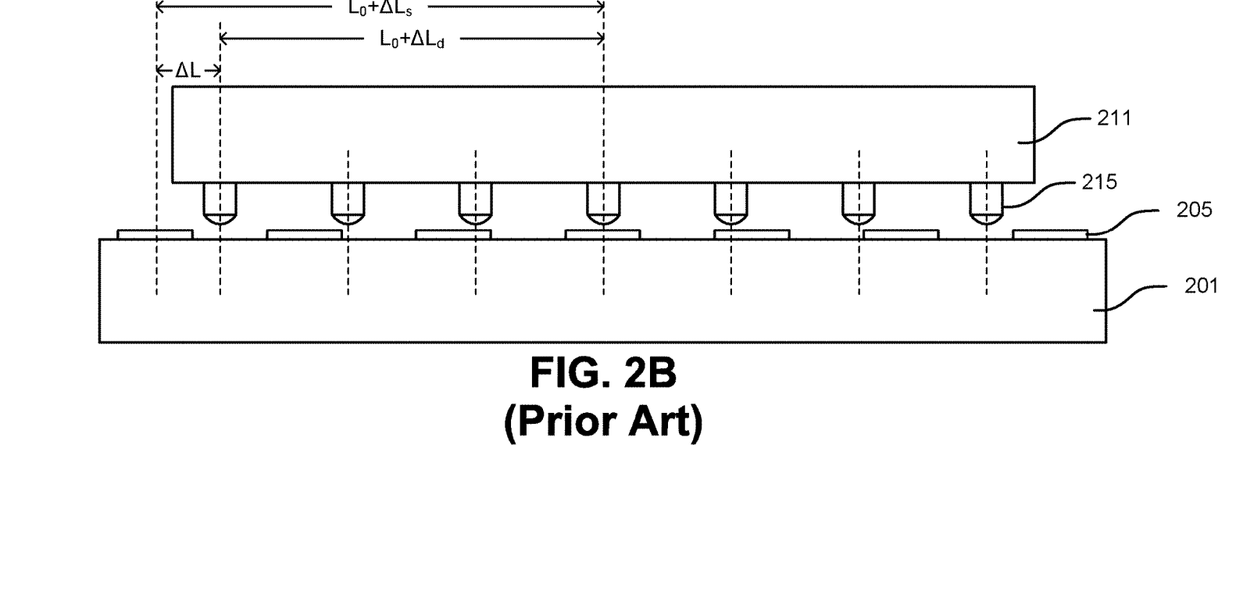
FIG. 2B (prior art) is a cross sectional view of a die and a substrate with different coefficients of thermal expansion at an elevated temperature.

FIG. 2A is a cross sectional side view of a die and a substrate of a 3DIC with different coefficients of thermal expansion at room temperature and FIG. 2B is a cross sectional side view of the die and the substrate at an elevated temperature. The die 211 includes multiple bumps 215 that are aligned to the contact pads 205 of the substrate 201. The die may, for example, be made of silicon, which has a low coefficient of thermal expansion (CTE). For instance, silicon has a CTE of about 1.5 ppm/° C. The substrate may be, for example, a printed circuit board (PCB) or an organic interposer with a higher CTE. For instance, a PCB has a CTE of that is 10 times larger than the CTE of silicon. As such, the substrate expands faster than the die.

At room temperature, the bumps 215 of the die 211 are aligned to the contact pads 205 of the substrate 201 and provide an electrical connection between the die 211 and the substrate 201. During certain fabrication steps and/or during the use of the 3DIC, the 3DIC may be subjected to elevated temperatures. For instance during a solder reflow process of the fabrication of the 3DIC, the 3DIC may be exposed to an elevated temperature to cause the solder to melt and reflow for establishing electrical and/or mechanical connections between the different components of the 3DIC. In another example, during the use of the 3DIC, certain components of the 3DIC may dissipate power in the form of thermal energy, causing the 3DIC to heat up. When the 3DIC is exposed to an elevated temperature, the die 211 and the substrate 201 may expand in accordance with their respective CTE. Since the die 211 and the substrate 201 have different CTE, beyond a certain temperature, the bumps 215 and the pads 205 may misalign.

As shown in FIG. 2B, at an elevated temperature, due to the mismatch in the coefficient of thermal expansion, the contact pads 205 of the substrate 201 are misaligned from the bumps 215 of the die 211. That is, when the temperature of the die 211 and the substrate 201 is elevated, the substrate experiences a larger thermal expansion than the die. For instance, the amount of linear expansion of the die 211 and the substrate 201 is as follows:

$$\Delta L_s = \alpha_s L_0 \Delta T \tag{1}$$

$$\Delta L_d = \alpha_d L_0 \Delta T \tag{2}$$

$$\Delta L = (\alpha_s - \alpha_d) L_0 \Delta T \tag{3}$$

Where $\Delta L_s$ is the amount of thermal expansion experienced by the substrate 201, $\Delta L_d$ is the amount of thermal expansion experienced by the die 211, $\alpha_s$ is the linear CTE of the substrate 201, $\alpha_d$ is the linear CTE of the die 211, $L_0$ is the length at room temperature, and $\Delta T$ is the change in temperature. $\Delta L$ is the difference in thermal expansion between the substrate and the die due to the difference in the CTE between the substrate and the die.

As illustrated in FIG. 2B, the misalignment is more pronounced near the edge of the substrates. That is, the bumps 215 and contact pads 205 that are near the center of the substrates 201, 211 are still aligned at an elevated temperature, but the bumps 215 and contact pads 205 that are near the edge of the substrate are more severely misaligned.

To maintain alignment of the bumps 215 and the pads 205 at room temperature and at elevated temperature, the pads may be designed with an elongated shape. When the 3DIC is at room temperature, the bumps 215 are aligned to a first end of the elongated pad and when the 3DIC is at an elevated temperature, the bumps 215 are aligned to a second end of the elongated pad. For instance, the pads may have an oval shape or an elliptical shape.

Figure 3A:
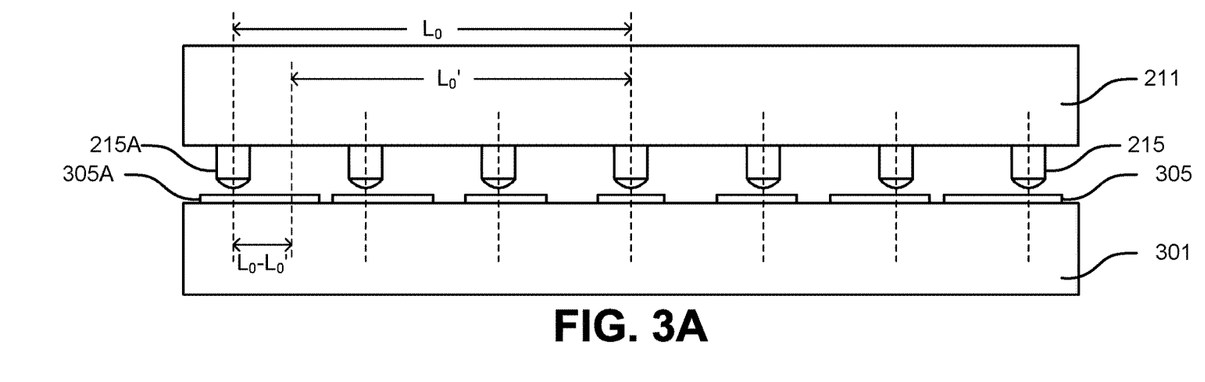
FIG. 3A is a cross sectional view of a die and a substrate with elongated pads at room temperature, according to one embodiment.
Figure 3B:
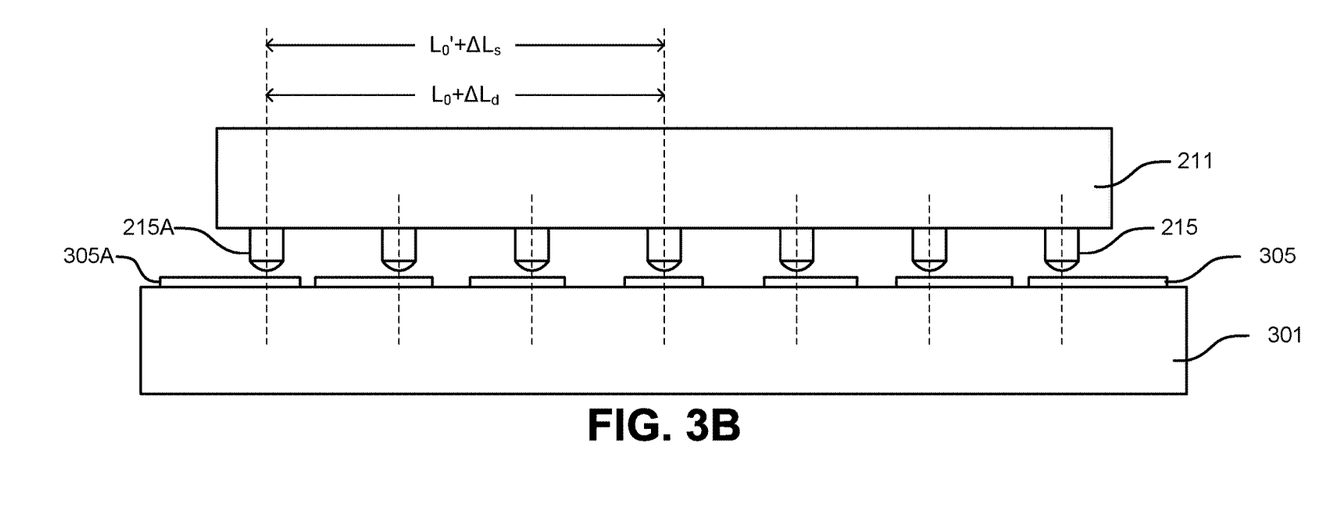
FIG. 3B is a cross sectional view of a die and a substrate with elongated pads at an elevated temperature, according to one embodiment.

FIG. 3A is a cross sectional side view of a die and a substrate with elongated pads at room temperature and FIG. 3B is a cross sectional side view of the die and the substrate with elongated pads at an elevated temperature. As illustrated in FIG. 3A, the contact pads 305 of the substrate are elongated. In some embodiments, the elongation of the pads may be dependent on the position of the pad. In this example, the contact pads 305 that are closer to the edge of the substrate are more elongated than the elongated contact pads 305 that are near the center of the substrate. Furthermore, the amount of elongation of the pads may further be dependent on the CTE mismatch between the die 211 and the substrate 301, and a maximum temperature the 3DIC is expected to be exposed to.

As illustrated in FIG. 3B, since the pads are elongated, after the substrate is expanded at elevated temperatures, the elongated contact pads 305 of the substrate 301 are still aligned to the bumps 215 of the die 211. As such, the bumps 215 of the die can be electrically connected to the elongated contact pads 305 of the substrate in an elevated temperature environment, such as during a solder reflow process. After the die 211 and the substrate 301 cool down to room temperature, the bumps 215 and the contact pads 305 would still be aligned.

As shown in FIG. 3A and FIG. 3B, at room temperature, the distance from the center of the die 211 to the center of a bump 215A is $L_0$, the distance between the center of the substrate 301 and a first end of a pad 305A is $L_0$, and the distance from the center of the substrate 301 to the second end of the pad 305A is $L_0'$. Furthermore, at an elevated temperature, the distance from the center of the die 211 to the center of the bump 215A is $L_0 + \Delta L_d$ and the distance from the center of the substrate 301 to the second end of the pad 305A is $L_0' + \Delta L_s$. Since, at the elevated temperature, the second end of the pad 305A is aligned to the bump 215A:

$$L_0 + \Delta L_d = L_0' + \Delta L_s \quad (4)$$

which can be re-written as:

$$L_0 + \alpha_d L_0 \Delta T = L_0' + \alpha_s L_0' \Delta T \quad (5)$$

$$\text{Thus: } L_0' = L_0 \frac{1 + \alpha_d \Delta T}{1 + \alpha_s \Delta T} \quad (6)$$

Figure 4A:
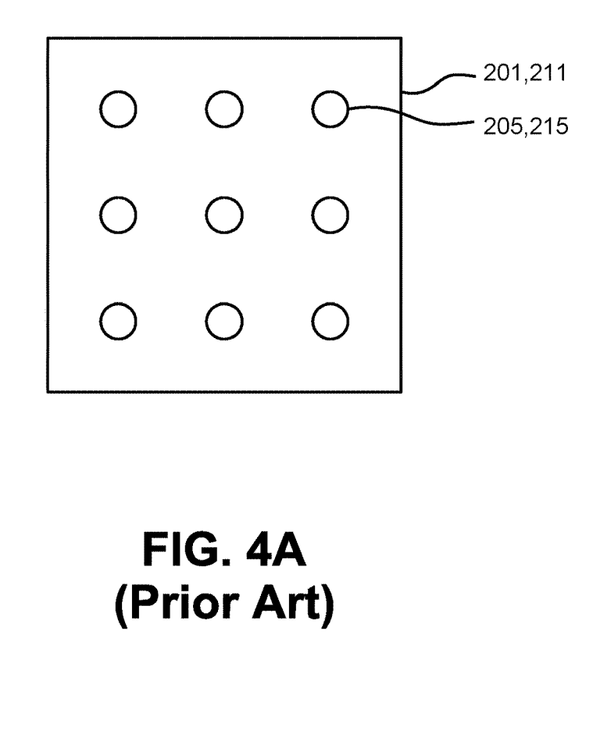
FIG. 4A (prior art) is a top view of a die and a substrate with different coefficients of thermal expansion at room temperature FIG. 4B (prior art) is a top view of a die and a substrate with different coefficients of thermal expansion at an elevated temperature.
Figure 4B:
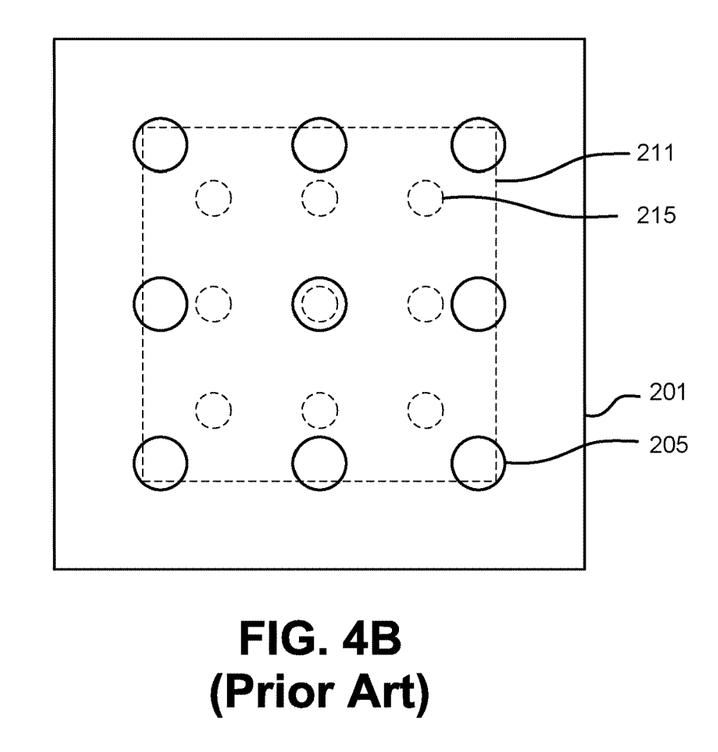

FIG. 4A is a top view of a die and a substrate with different coefficients of thermal expansion at room temperature, and FIG. 4B is a top view of the die and the substrate at an elevated temperature. In FIG. 4B, the dotted lines represent the die 211 with a lower CTE and the solid lines represent the substrate 201 with a higher CTE. As illustrated in FIG. 4A, the bumps 215 of the die 211 and the pads 205 of the substrate 201 are designed to be aligned at room temperature (so they are overlapping in FIG. 4A). Due to the mismatch in CTE, as shown in FIG. 4B, the substrate 201 expands more than the die 211 and thus, the bumps 215 of the die 211 are mis-aligned from the pads 205 of the substrate.

Figure 5A:
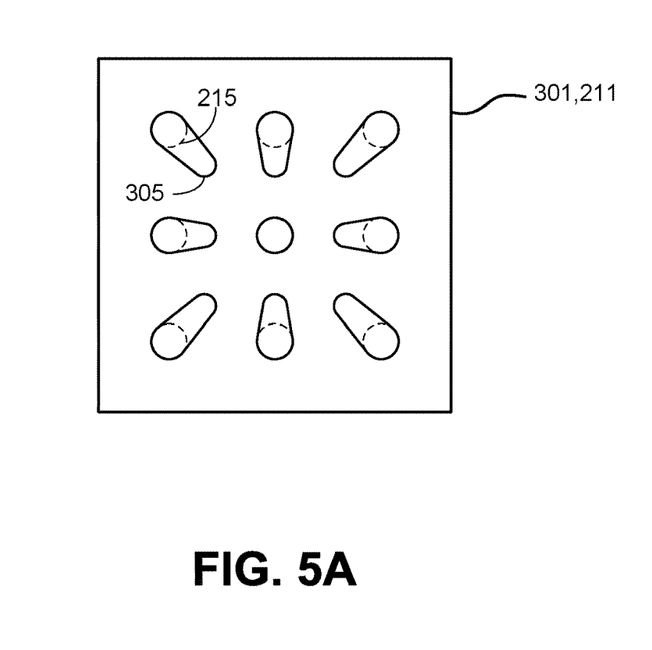
FIG. 5A is a top view of a die and a substrate with elongated pads at room temperature, according to one embodiment.
Figure 5B:
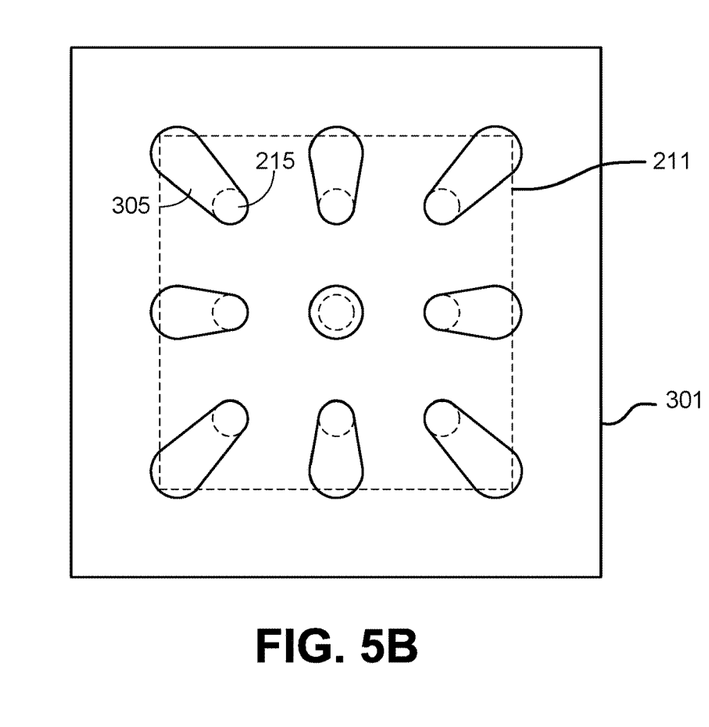
FIG. 5B is a top view of a die and a substrate with elongated pads at an elevated temperature, according to one embodiment.

FIG. 5A is a top view of a die and a substrate with elongated pads at room temperature and FIG. 5B is a top view of a die and a substrate with elongated pads at an elevated temperature, according to one embodiment. As illustrated in FIG. 5A, the bumps 215 of the die 211 are aligned, at room temperature, to the elongated contact pads 305 of the substrate 301. In one embodiment, the bumps 215 of the die 211 are designed to be aligned near a first end of the elongated contact pads 305 of the substrate 301. When the substrate 301 expands due to an elevated temperature, the bumps 215 of the die 211 stayed aligned to the elongated contact pads 305 of the substrate 301. In one embodiment, the pads are designed to be aligned to the bumps 215 of the die 211, at an elevated temperature, at near a second end of the elongated contact pads 305, opposite to the first end.

In some embodiments, the pads 305 are elongated in the direction of expansion of the substrate 301. For instance, the pads 305 are elongated radially from the center of the substrate 301. In another example, the pads 305 are elongated radially from a point other than the center of the substrate.

In some embodiments, pads 305 that are closer to the center of the substrate have a smaller elongation than pads that are further away from the center of the substrate. In other embodiments, pads 305 that are closer to the center of the substrate have a smaller area than pads 305 that are further away from the center of the substrate.

Figure 6A:
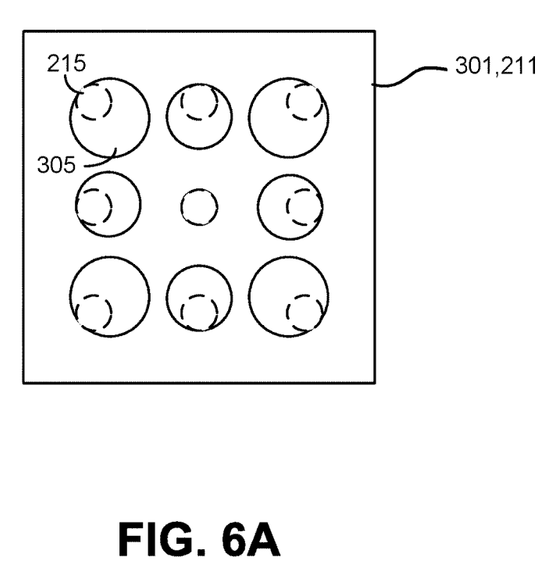
FIG. 6A is a top view of a die and a substrate with elongated pads at room temperature, according to one embodiment.
Figure 6B:
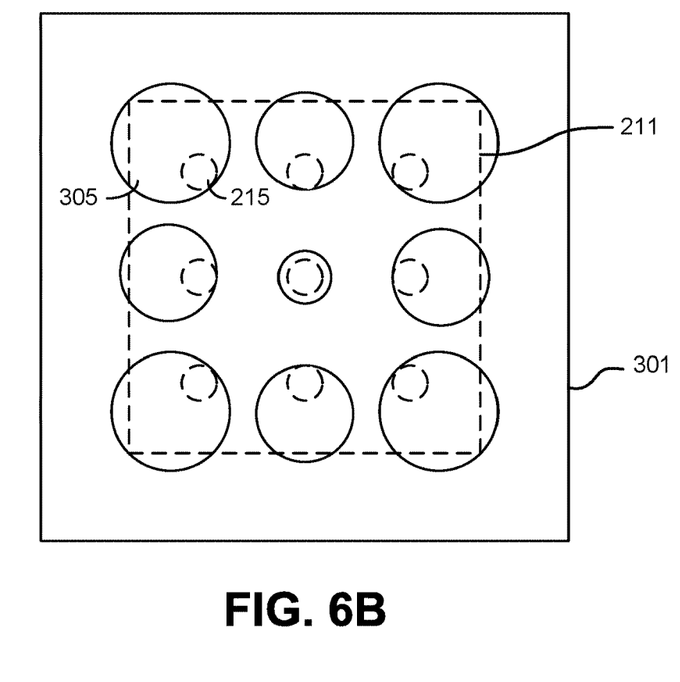
FIG. 6B is a top view of a die and a substrate with elongated pads at an elevated temperature, according to one embodiment.

FIG. 6A is a top view of a die and a substrate with elongated pads at room temperature and FIG. 6B is a top view of a die and a substrate with elongated pads at an elevated temperature, according to another embodiment. In the embodiment of FIG. 6, the elongated contact pads 305 of the substrate 301 have a circular shape. The size of the elongated contact pads 305 are based on the distance of the pad 305 to the center of the substrate. Elongated contact pads 305 that are further from the center of the substrate are larger than elongated contact pads 305 that are closer to the center of the substrate. In other embodiments, other shapes, such as hexagonal shapes, may be used for the elongated contact pads 305.

Figure 7:
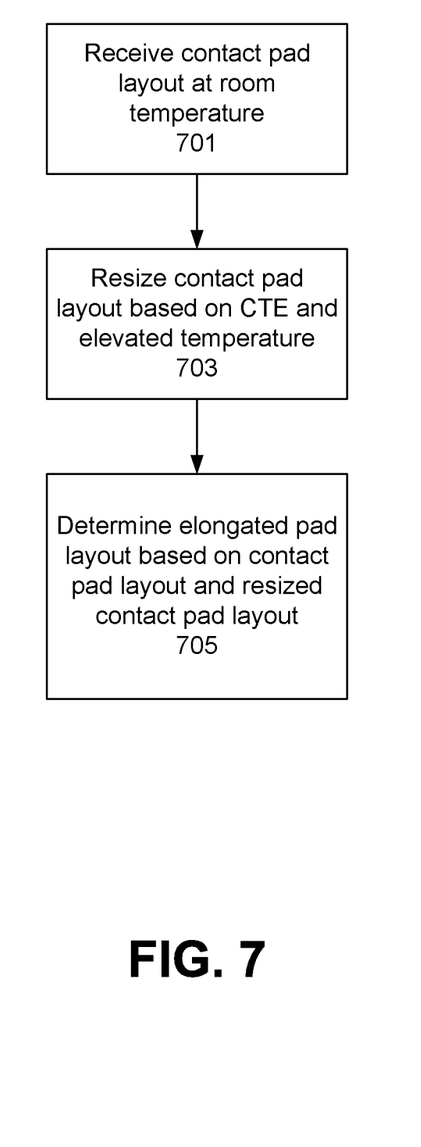
FIG. 7 is a flow diagram for designing the pads of a printed circuit board, according to one embodiment.

FIG. 7 is a flow diagram for designing the elongated pads of a printed circuit board, according to one embodiment. A contact pad layout at room temperature is received 701. The contact pad layout is resized 703 based on the CTE of the substrate 301 and the elevated temperature. Base on the contact pad layout at room temperature and the resized contact pad layout, an elongated pad layout is determined 705.

Although the detailed description contains many specifics, these should not be construed as limiting the scope of the invention but merely as illustrating different examples and aspects of the invention. It should be appreciated that the scope of the invention includes other embodiments not discussed in detail above. Various modifications, changes, and variations which will be apparent to those skilled in the art may be made in the arrangement, operation, and details of the method and apparatus of the present invention disclosed herein without departing from the spirit and scope of the invention as defined in the appended claims. Therefore, the scope of the invention should be determined by the appended claims and their legal equivalents. Furthermore, no element, component or method step is intended to be dedicated to the public regardless of whether the element, component or method step is explicitly recited in the claims.

In the claims, reference to an element in the singular is not intended to mean "one and only one" unless explicitly stated, but rather is meant to mean "one or more." In addition, it is not necessary for a device or method to address every problem that is solvable by different embodiments of the invention in order to be encompassed by the claims.

What is claimed is:

1. A 3DIC comprising:
   a die, the die having a plurality of bumps; and
   a substrate having a plurality of elongated contact pads, the elongated contact pads making electrical contact with the bumps and shaped to maintain alignment with the bumps over a temperature range, wherein the elongated contact pads are elongated towards a center of the substrate, the elongated contact pads having an oval shape with an axis of symmetry in a radial direction from the center of the substrate, wherein a curvature of the elongated contact pad at a proximal end closer to the center of the substrate is larger than a curvature of the elongated contact pad at a distal end further away from the center of the substrate.

2. The 3DIC of claim 1, wherein the first temperature is room temperature and the second temperature is a solder reflux temperature.

3. The 3DIC of claim 1, wherein the substrate has a coefficient of thermal expansion at least 10 times larger than silicon.

4. The 3DIC of claim 1, wherein the plurality of elongated pads are elongated radially from a central point.

5. The 3DIC of claim 1, wherein elongated pads closer to the central point have a smaller area than elongated pads further from the central point.

6. The 3DIC of claim 1, wherein elongated pads further from the central point have a larger elongation than elongated pads closer to the central point.

7. The 3DIC of claim 1, wherein the central point is located in a center of the substrate.

8. The 3DIC of claim 1, wherein the elongated contact pads have an oval shape.

9. The 3DIC of claim 8, wherein a first end of the elongated contact pads are aligned to the plurality of corresponding bumps of the die at a first temperature, and wherein a second end of the elongated contact pads are aligned to the plurality of corresponding bumps of the die at a second temperature.

10. The 3DIC of claim 1, wherein the elongated contact pads have a circular shape.

11. The 3DIC of claim 10, wherein the radius of the circularly shaped elongated pad is based on a distance between a location of the elongated pad and a central point.

12. The 3DIC of claim 1, wherein the substrate is an organic interposer.

13. The 3DIC of claim 1, wherein the die is a silicon interposer.

14. The 3DIC of claim 1, wherein the die is an active die.

* * * * *